(12) United States Patent
Morifuji

(10) Patent No.: US 7,094,663 B2
(45) Date of Patent: Aug. 22, 2006

(54) SEMICONDUCTOR DEVICE AND METHOD OF MANUFACTURING THE SAME

(75) Inventor: Eiji Morifuji, Yokohama (JP)

(73) Assignee: Kabushiki Kaisha Toshiba, Kanagawa-Ken (JP)

( * ) Notice: Subject to any disclaimer, the term of this patent is extended or adjusted under 35 U.S.C. 154(b) by 0 days.

(21) Appl. No.: 10/929,782

(22) Filed: Aug. 31, 2004

(65) Prior Publication Data

US 2005/0032315 A1   Feb. 10, 2005

Related U.S. Application Data

(62) Division of application No. 09/493,063, filed on Jan. 28, 2000, now Pat. No. 6,873,014.

(30) Foreign Application Priority Data

Jan. 29, 1999   (JP)   ............... 11-022484

(51) Int. Cl.
 H01L 21/76   (2006.01)
 H01L 21/425   (2006.01)
 H01L 21/84   (2006.01)

(52) U.S. Cl. .............. 438/407; 438/162; 438/528

(58) Field of Classification Search ................ 438/162, 438/407, 408, 528, 234, 301
See application file for complete search history.

(56) References Cited

U.S. PATENT DOCUMENTS

| | | | |
|---|---|---|---|
| 5,241,203 A | 8/1993 | Hsu et al. | |
| 5,528,065 A | 6/1996 | Battersby et al. | |
| 5,554,873 A | 9/1996 | Erdeljac et al. | |
| 5,696,403 A | 12/1997 | Rostoker et al. | |
| 5,744,394 A | 4/1998 | Iguchi et al. | |
| 5,744,840 A | 4/1998 | Ng | |
| 5,854,504 A | 12/1998 | Consiglio | |
| 5,898,206 A | 4/1999 | Yamamoto | |
| 5,917,223 A * | 6/1999 | Ohuchi et al. | ............. 257/384 |
| 5,932,917 A | 8/1999 | Miura | |
| 5,939,753 A | 8/1999 | Ma et al. | |
| 5,990,504 A | 11/1999 | Morifuji | |
| 6,071,763 A | 6/2000 | Lee | |
| 6,118,154 A | 9/2000 | Yamaguchi et al. | |
| 6,157,065 A | 12/2000 | Huang et al. | |
| 6,163,056 A | 12/2000 | Maekawa | |
| 6,472,723 B1 | 10/2002 | Jarstad et al. | |

FOREIGN PATENT DOCUMENTS

JP   63-278273   11/1988

* cited by examiner

Primary Examiner—Walter L. Lindsay, Jr.
(74) Attorney, Agent, or Firm—Pillsbury Winthrop Shaw Pittman LLP

(57) ABSTRACT

The semiconductor device has a low-resistance layer provided under the interconnection extending from the signal input to a gate of MOSFET. The low-resistance layer decreases the substrate resistance and the noise characteristic of the semiconductor device can also be improved. The low-resistance layer can be provided on a surface of the substrate or a polysilicon interconnection.

3 Claims, 7 Drawing Sheets

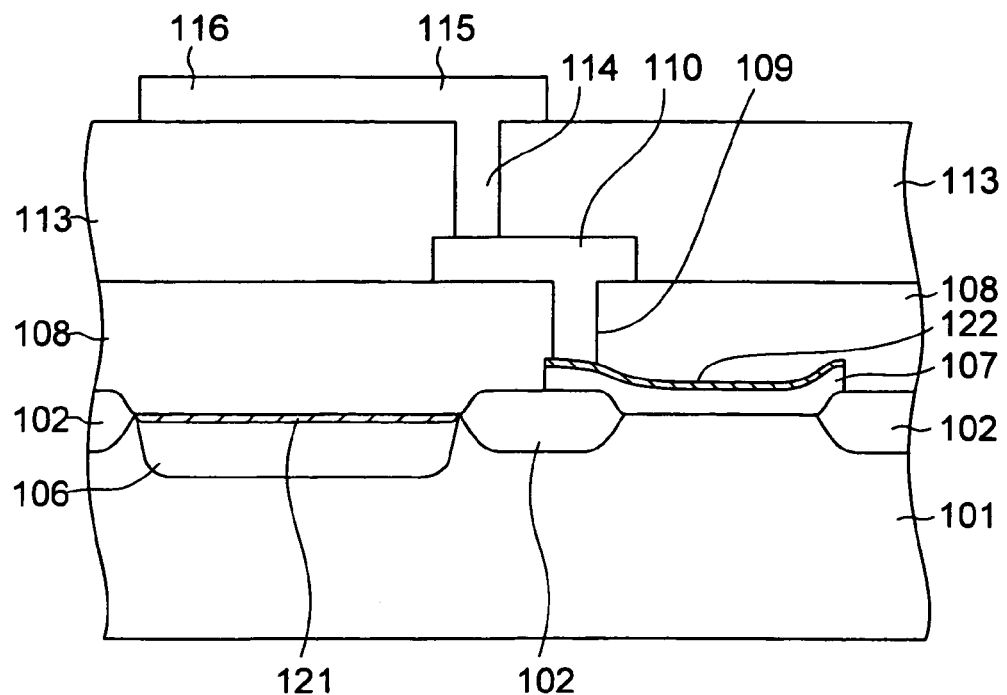
FIG. 2A a-a' SECTION
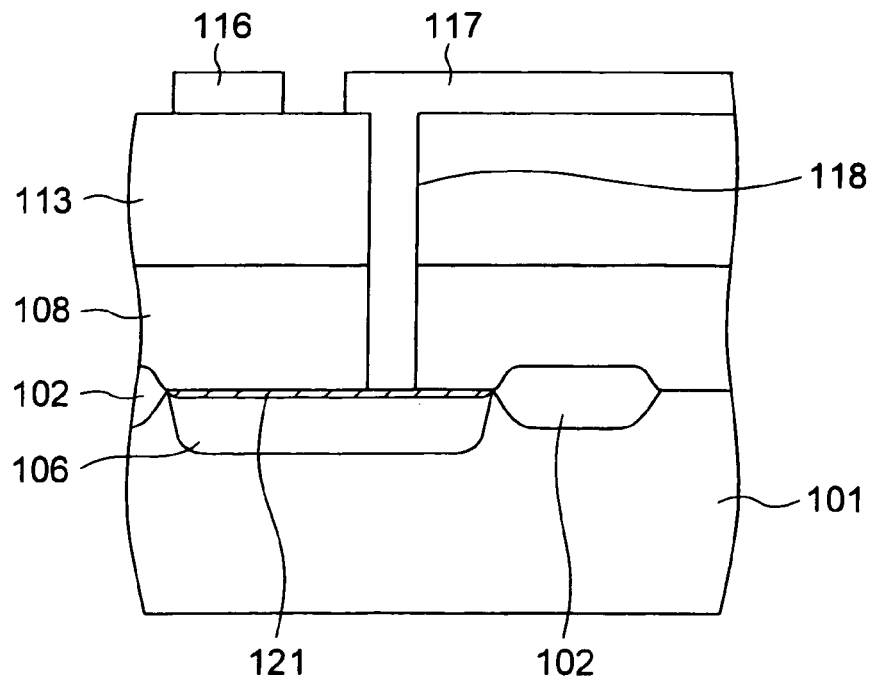
FIG. 2B b-b' SECTION

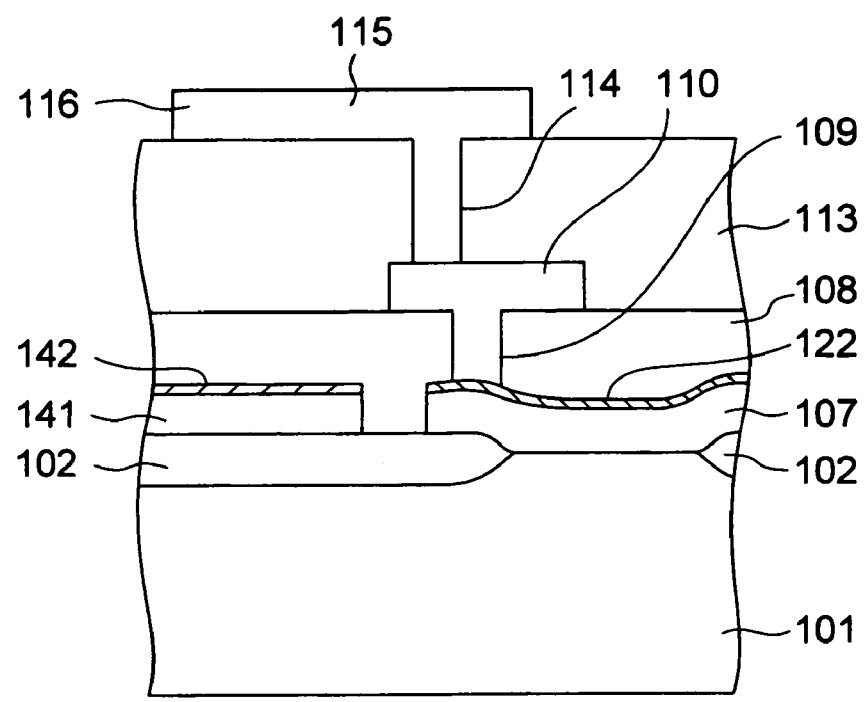
FIG. 6A  c-c' SECTION
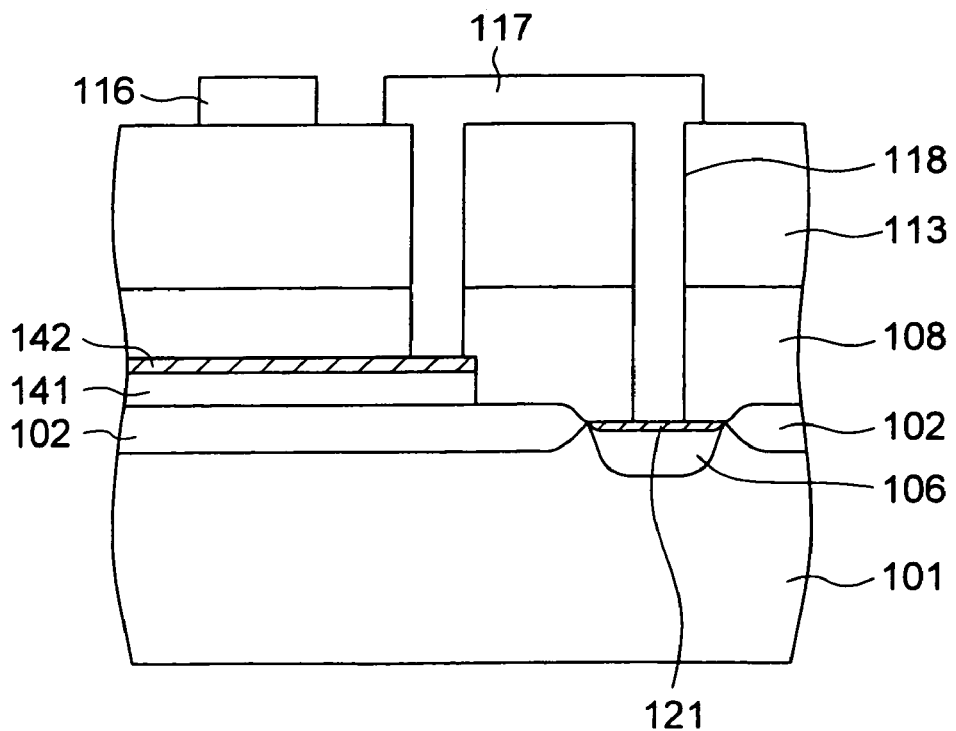
FIG. 6B  d-d' SECTION

SEMICONDUCTOR DEVICE AND METHOD OF MANUFACTURING THE SAME

CROSS-REFERENCE TO RELATED APPLICATIONS

This is a Divisional Application of U.S. application Ser. No. 09/493,063, filed Jan. 28, 2000, now U.S. Pat. No. 6,873,014, which is based upon and claims the benefit of priority to Japanese Patent Application No. 11-022484, filed Jan. 29, 1999, the entire contents of both of which are incorporated herein by reference.

BACKGROUND OF THE INVENTION

The present invention relates generally to a semiconductor device, and more particularly to a semiconductor device suited to a low-noise type transistor, for example, a MOSFET and an integrated circuit using the same.

A low-noise characteristic is especially required of, e.g., an amplifier circuit among a variety of circuits included in a semiconductor device.

A comb-shape structured transistor has hitherto been used as a transistor in which the above low-noise characteristic is actualized.

This comb-shape structured transistor having, as illustrated in a plan view of FIG. 9, source regions 3 and drain regions 4 which have alternately been formed with strips of gate electrodes 7 extending therebetween, is configured as a whole in a laterally elongate rectangular shape. That is, the plurality of gate electrodes 7 alternately extend across long sides of this rectangle, and contact holes 9 and electrodes 10 are so provided as to connect the adjacent gate electrodes to each other on both sides of the long sides of the source-drain regions.

In the case of the comb-shape structured transistor, for reducing a resistance of the gate electrode 7, a silicide layer is stacked on a polysilicon layer to decrease the resistance, thereby reducing noises.

Incidentally, in the amplifier circuit including the comb-shape structured transistor of which the low-noise characteristic described above is required, there exists an equivalent circuit in which a series circuit constructed of a substrate resistance from an interconnection connected to an input stage thereof to a substrate contact via an inter-layer film capacitance existing under a pad, is connected to the input stage. A structure thereof will be explained with reference to FIG. 10.

Referring to FIG. 10, a field oxide layer 2 for device isolation on the surface of a semiconductor substrate 1 so as to surround device regions 3, 4. A part of the field oxide layer 2 is formed with an opening 5 for taking out potential of the substrate, and the substrate surface at this opening 5 is provided with a high -concentration layer 6, exhibiting the same conductivity type as that of a well, for determining potential of a substrate or well.

A gate polysilicon layer 7 is provided on the device regions 3, 4 so as to extend over some of the field oxide layer 2 surrounding the device regions 3, 4, and the whole is covered with an inter-layer insulating film 8.

A contact hole 9 is formed in the inter-layer insulating film 8 at the location corresponding to the gate polysilicon layer 7, and the contact hole 9 is connected to a metal interconnection 10. Furthermore, a contact hole 11 is provided corresponding to the high-concentration layer 6 for taking out the well potential, and the layer 6 is connected via this contact hole 11 to an interconnection 12 for taking out the well potential.

Furthermore, a second inter-layer insulating film 13 is provided on those elements, a contact hole 14 is formed corresponding to the gate interconnection 10, and an interconnection 15 for connecting the gate electrode is provided on the second inter-layer insulating film 13.

Based on this construction, however, as illustrated in FIG. 10, there is configured an equivalent circuit in which a substrate resistance R1 and an inter-layer film capacitance C1 are connected in series between the well potential taking-out interconnection 12 and the gate interconnection 15.

Then, heat noises caused by this substrate resistance R1 enter the input stage of the transistor via the inter-layer film capacitance C1, resulting in deterioration of the noise characteristic. In particular, the deterioration of the noise characteristic due to the substrate resistance becomes conspicuous in a MOSFET with a high gate input impedance.

SUMMARY OF THE INVENTION

Under such circumstances, it is a primary object of the present invention to provide a semiconductor device exhibiting a preferable noise characteristic.

According to one aspect of the present invention, there is provided a semiconductor device comprising:
a semiconductor substrate;
a MOSFET formed on the substrate;
a first interconnection connected to a gate of the MOSFET;
a high concentration impurity diffused region located under the first interconnection and at a surface part of the semiconductor substrate;
a second interconnection connected to the high concentration impurity diffused region; and
a low resistance layer provided on the upper surface of the high concentration impurity diffused region.

The semiconductor device according to the present invention includes the low-resistance layer provided under the interconnection extending from the signal input, whereby the substrate resistance is decreased by this low-resistance layer, the heat noises caused by the substrate resistance can be reduced, and the noise characteristic of the semiconductor device can also be improved.

If the silicide layer given the same potential as that of the substrate or the well is used as the low-resistance layer, an ideal low-resistance shield is easily obtained, and it is feasible to acquire a high gain due to the decrease in the inter-layer capacitance and to attain the simplified interconnection.

Further, there is neither increase in the number of interconnection layers due to the formation of the shield layer nor increment in the number of processes.

According to another aspect of the present invention, there is provided a semiconductor device comprising:
a semiconductor substrate;
a MOSFET formed on the substrate;
a first interconnection connected to a gate of the MOSFET;
a high concentration impurity diffused region located below the first interconnection and at a surface part of the semiconductor substrate;
a second interconnection connected to the high concentration impurity diffused region;
a low resistance layer provided on the upper surface of the high concentration impurity diffused region; and
a polysilicon layer provided below the first interconnection, said polysilicon layer being connected to the second interconnection.

According to further aspect of the present invention, there is provided a method for manufacturing a semiconductor device comprising the steps of:

forming device isolation layer for defining a device region and a high concentration impurity diffused region;

forming a gate electrode on a surface of the substrate within the device region;

implanting ions in the device region and the high concentration impurity diffused region with the device isolation layers and the gate electrode being as implantation mask;

depositing low resistance layer at least on the upper surface of the high concentration impurity diffused region;

depositing an inter-layer insulating film;

forming a first interconnection connected to the gate electrode and a second interconnection connected to the high concentration impurity diffused region on the said inter-layer insulating film, at least the first interconnection being disposed so that it runs above the high concentration impurity diffused region.

BRIEF DESCRIPTION OF THE DRAWINGS

FIGS. 2A and 2B are sectional views of the device, corresponding to FIG. 1;

FIGS. 6A and 6B are sectional views of the device, corresponding to FIG. 5;

DESCRIPTION OF THE PREFERRED EMBODIMENTS

A few embodiments of the present invention will hereinafter be described in depth with reference to the accompanying drawings.

Figure 1:
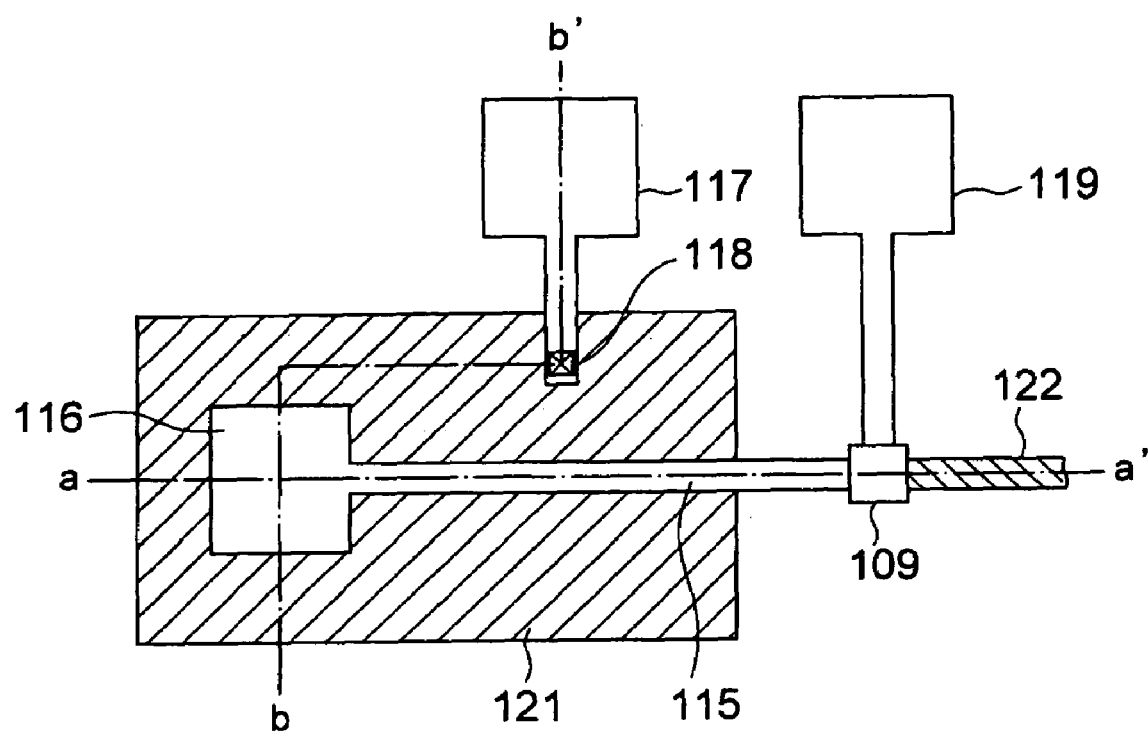
FIG. 1 is a plan view showing a layout of an input stage of a semiconductor device in a first embodiment of the present invention.
Figure 9:
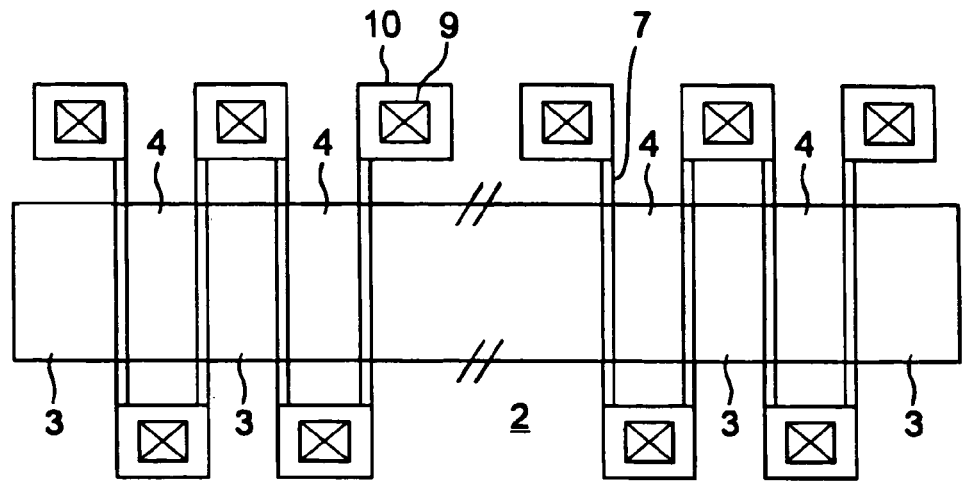
FIG. 9 is a plan view illustrating a conventional comb-shape structured transistor as a low-noise transistor which has hitherto been used.
Figure 10:
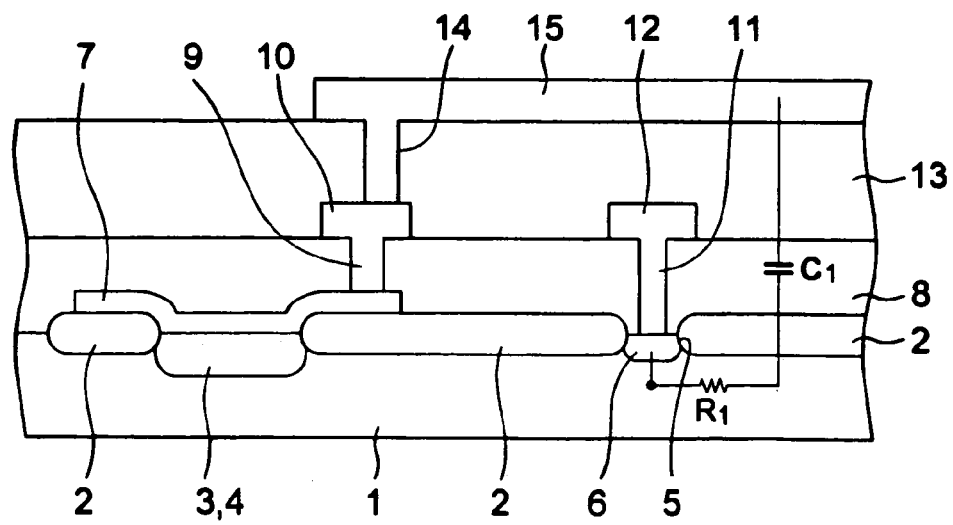
FIG. 10 is a sectional view of the device, showing a problem inherent in a prior art input transistor.
Figure 11:
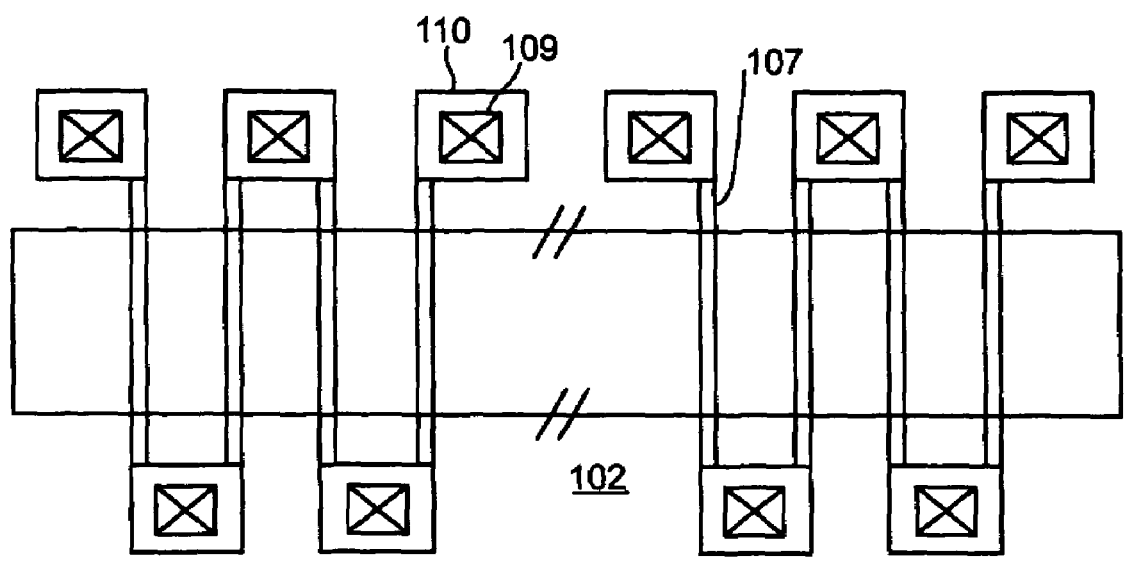
FIG. 11 is a plan view illustrating a plurality of MOSFETs disposed in a comb-like shape on the semiconductor substrate to form an amplifier stage in accordance with the present invention.

FIG. 1 is a plan view showing a layout of a semiconductor device in a first embodiment of the present invention. FIG. 2A shows a cross sectional view of the semiconductor device along the line a–a' in FIG. 1 and FIG. 2B shows a cross sectional view of the semiconductor device along the line b–b' in FIG. 1. FIGS. 1, 2A and 2B show a gate area of a MOSFET at an input stage of a low-noise amplifier. FIG. 11 shows a plurality of MOSFETs arranged in a comb-like shape to form an amplifier stage. Throughout FIGS. 1, 2A and 2B, the elements corresponding to those in the prior art explained in FIGS. 9 and 10 are marked with the reference numerals 100s.

At the surface part of a silicon substrate 101, a device region and a substrate potential take-out region enveloped and isolated by a field oxide layer 102. At the surface part of the substrate surface in the substrate potential take-out region is formed with an impurity high-concentration diffused region 106, having the same conductivity type as that of a well, for determining a well potential, and a shield layer 121 composed of a metal silicide layer is provided on the surface of this layer 106.

Furthermore, a polysilicon gate 107 is provided via a gate oxide layer (not shown) on the semiconductor substrate at the device region, and the surface of this gate 107 is also covered with a metal silicide layer 122.

The whole is covered with an inter-layer insulating film 108, a contact hole 109 for a connection to the gate 107 is formed in the inter-layer insulating film 108 filled with aluminum, etc., thus forming a first layer interconnection 110. Further, an insulating film 113 is deposited thereon, a contact hole 114 formed therein is filled with aluminum, etc., whereby a gate input take-out interconnection 115 and a gate input oriented pad 116 are provided on the insulating film 113.

Moreover, a substrate contact take-out pad 117 is connected via a contact 118 to the shield layer 121, and further a power source voltage pad 119 is also provided. Thus, the shield film 121 serves as the substrate contact area.

In the first embodiment, as indicated by hatching in FIGS. 1, 2A and 2B, the silicide layer is provided on the surface of the silicon substrate under the take-out pad as well as on the interconnection in the gate area of the MOSFET at the input stage, thereby decreasing a substrate resistance and heat noises.

Figure 3:
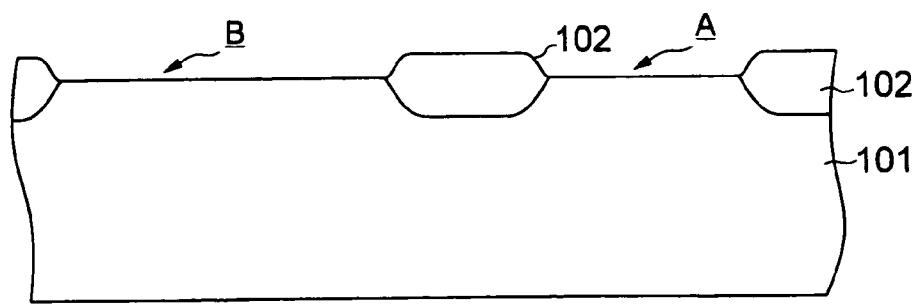
FIG. 3 is a sectional view showing one process step for obtaining the configurations shown in FIGS. 1, 2A and 2B.
Figure 4:
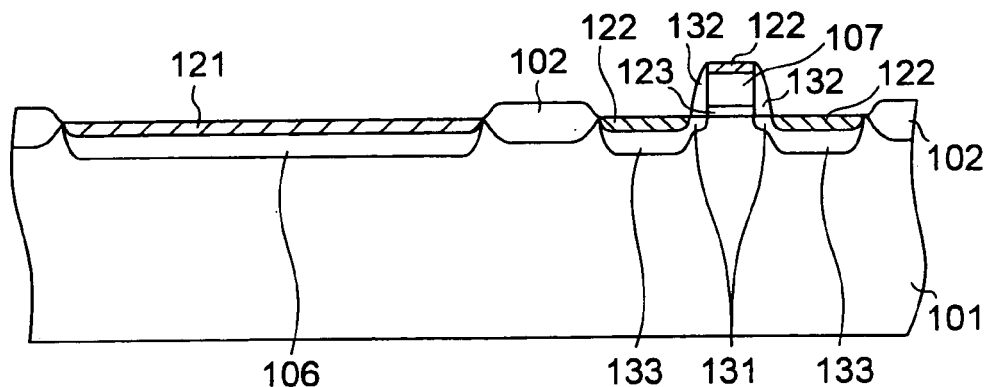
FIG. 4 is a sectional view showing a process step subsequent to the process in FIG. 3.

FIGS. 3 and 4 are sectional views showing steps of forming the silicide layer. To start with, the well is provided on the surface of a semiconductor substrate 101, and thereafter a field oxide layer 102 for a device isolation is provided by a selective oxidation method such as a LOCOS method (FIG. 3). Then, a device region A is isolated from a substrate potential take-out area B conceived as an area corresponding to a downward position of the gate input oriented pad and the interconnection of the gate area.

Next, a gate oxide layer 123 is provided in the device region by thermal oxidation, polysilicon is deposited thereon, and patterning is effected thereon, thereby obtaining a gate electrode 107 (FIG. 4). In an example shown in FIG. 4, the gate electrode and an impurity diffused region peripheral to this gate electrode take a well-known LDD structure. To be specific, after providing the gate electrode 107, with the gate electrode serving as an ion implantation mask, ions are implanted into the device region by a comparatively low energy, whereby a low-concentration diffused layer 131 is formed shallow. Subsequently, insulating layers such as silicon nitride layer and silicon oxide layer are deposited on the whole and etched back by an anisotropic etching method, whereby a side wall 132 is provided on a side surface of the gate electrode. With this side wall 132 serving as a mask, the ions are implanted by a comparatively high energy, whereby a high-concentration diffused layer 133 is formed deep. On this occasion, an impurity diffused layer 106 is provided in the substrate potential take-out region by implanting the ions of the same conductivity as that of the substrate. In the case of, e.g., an n-channel MOS, the ions, i.e., n-type impurities such as phosphorus are implanted into the device region, and the ions, viz., p-type impurities such as boron are implanted into the substrate potential take-out region.

Thereafter, silicide layers 122, 121 are provided in the device region and the substrate contact area by a salicide process (FIG. 4). The silicide layers formed herein may preferably involve the use of, e.g., $TiSi_2$, $CoSi_2$, NiSi, $PtSi_2$.

Thereafter, the inter-layer insulating film is provided by a CVD method, etc. and is formed with a contact hole in a necessary portion, and a metal interconnection is formed by a vapor deposition of a metal such as aluminum and effecting the patterning, thereby obtaining a structure as illustrated in FIG. 2.

As discussed above, in accordance with the first embodiment, the substrate potential take-out area is formed under the input pad and the interconnection extending from this input pad to the amplifier stage, the silicide layer is provided on the surface of this take-out area to reduce the resistance value, thus preventing the occurrence of the heat noises.

Further, in the case of the MOSFET, the MOSFET having a smaller gate width received a larger effect of the substrate with an increased impedance, deteriorates in terms of the noise characteristic and is therefore hard to be used in the low-noise circuit. The low-noise characteristic is, however, acquired even in the small-sized transistor by use of the above shield, and hence it is feasible to obtain the circuit configuration with the throttled current and to attain the reduction in the consumption of the electric power.

Further, the silicide shield layer is provided in the same process as that for the device region, and an increase in the number of processes is not therefore brought about.

Figure 5:
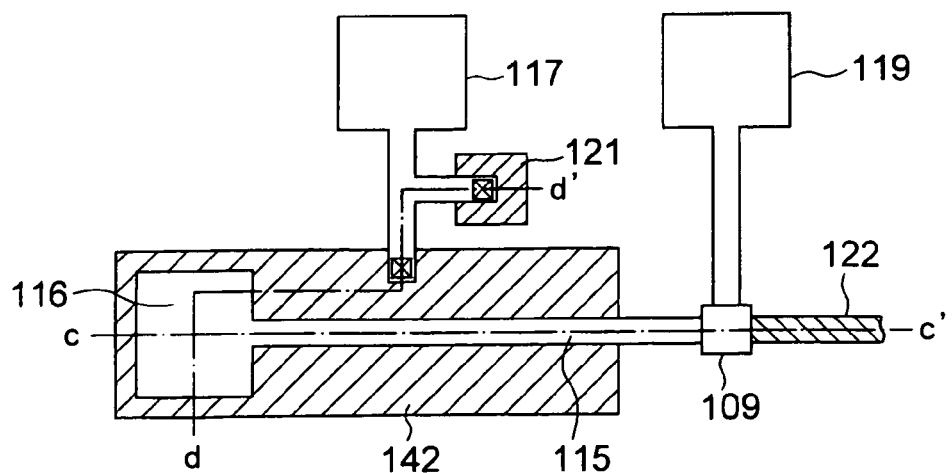
FIG. 5 is a plan view showing a Layout of the input stage of the semiconductor device in a second embodiment of the present invention.

FIG. 5 is a plan view showing a layout of the semiconductor device in a second embodiment of the present invention. FIGS. 6A and 6b are sectional views of the device taking along sectional lines c–c' and d–d', respectively. The same elements as those in FIGS. 1, 2A and 2B are marked with the same reference numerals.

A difference between the second embodiment and the first embodiment is that the silicide layer 121 in the substrate potential take-out region is disposed under the interconnection take-out pad as well as under the interconnection in the gate area of the MOSFET at the input stage of the low-noise amplifier in the first embodiment, however, a silicide layer 142 is disposed on a polysilicon layer 141 provided on an oxide layer (field oxide layer) for a device isolation in the second embodiment. The polysilicon layer 141 can be actualized by its being composed of the same layer as that of the gate electrode, and, in this case, the layers are simultaneously formed by patterning.

Moreover, the substrate potential take-out region 121 is provided not just under the gate take-out pad 116 and the interconnection 115 but in a region other than the region in which to form the silicide layer 142 as shown in FIG. 5. Then, the silicide layer 142 on the gate polysilicon layer 141 is connected to the substrate potential take-out region 121 and therefore has the same potential as the substrate potential, and these are connected to the substrate potential take-out pad 117 via a metal interconnection so that the potentials can be taken outside.

Figure 7:
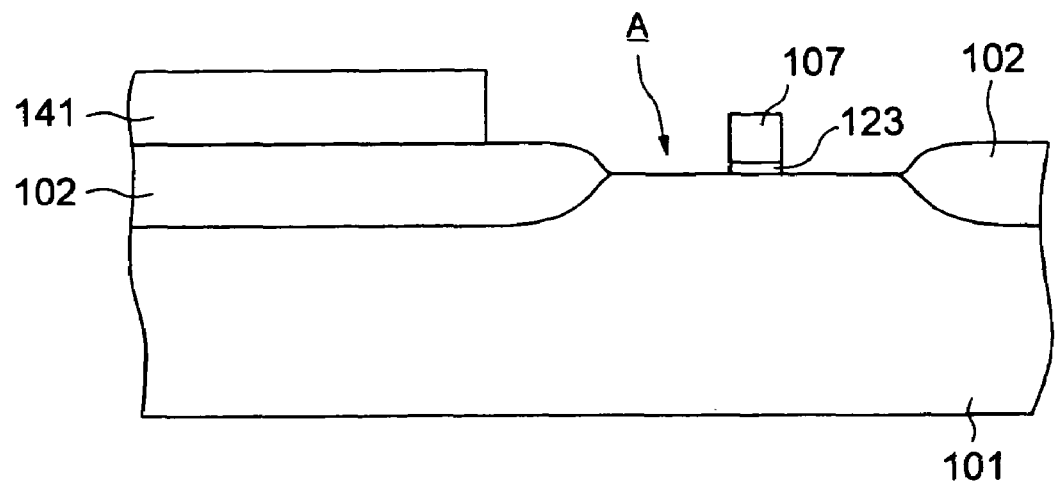
FIG. 7 is a sectional view showing one process step for obtaining the configurations shown in FIGS. 5 and 6.
Figure 8:
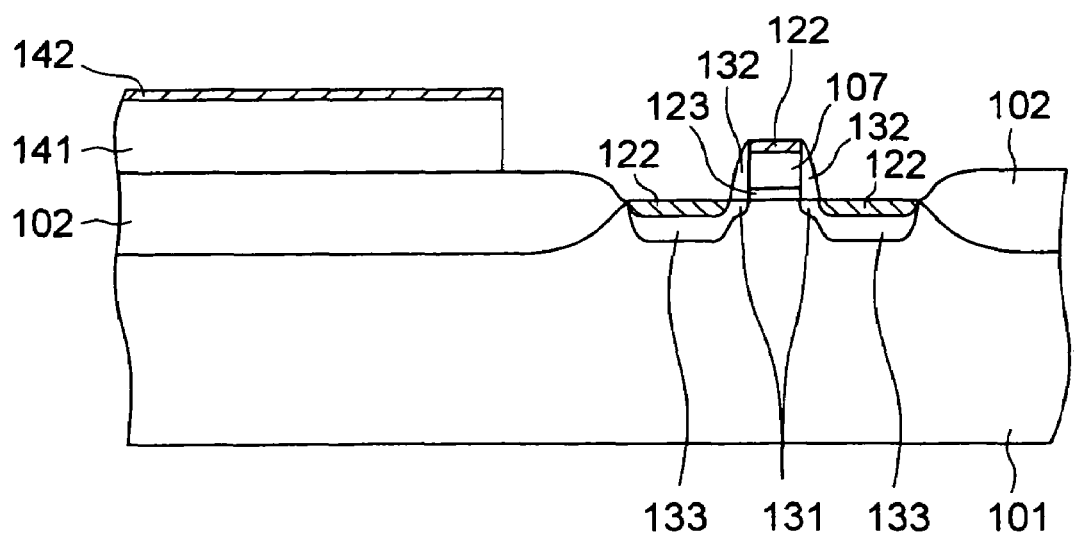
FIG. 8 is a sectional view showing a process step subsequent to the process in FIG. 7.

FIGS. 7 and 8 are sectional views showing process steps of forming the silicide layer in the second embodiment.

To begin with, after the well formed in the surface of the semiconductor substrate 101, the field oxide layer 102 for the device isolation is provided by the selective oxidation method such as the LOCOS method, and the device region A is separated (FIG. 7). Note that the substrate potential take-out region B is formed but is not shown in FIG. 7.

Next, a gate oxide layer 123 is provided by the thermal oxidation, the polysilicon is deposited thereon and subjected to the patterning, thereby forming a gate electrode 107 in the device region and a gate polysilicon layer 141 on the field oxide layer 102 corresponding to a predetermined gate arean interconnection and a lower portion of an interconnection take-out pad (FIG. 7).

Subsequently, a device is provided in the device region A. In the second embodiment also, the transistor to be manufactured takes the LDD structure, and the manufacturing process is the same as that in the first embodiment. There is carried out the ion implantation for forming the diffused layer of the transistor into the device region, and the ions of the same conductivity type as that of the substrate are implanted into the substrate potential take-out region 121. For instance, if the transistor is classified as an n-channel MOS transistor, the n-type ions are implanted into the device region, while the p-type ions are implanted into the substrate contact area.

Thereafter, the silicide layer is provided on the gate electrode and the substrate surface in the device region by the salicide process, and a silicide layer 142 is likewise provided on the gate polysilicon layer 141 in the same process (FIG. 8).

Thereafter, the inter-layer insulating film is provided by the CVD method or the like, a contact hole is formed in a required portion, a metal such as aluminum is then deposited, and a metal interconnection is formed by patterning, this completing the device.

In accordance with the second embodiment also, the silicide layer formed on the gate polysilicon layer is provided under the input pad 116 and the interconnection 115 extending from the input pad to the stage of the amplifier, of which the electric potential is set to the substrate potential, and it is therefore to decrease the substrate resistance and to attain the reduction in noises on the whole with the decreased heat noises.

Further, the silicide layer on the gate polysilicon is formed in the same process as that for the device region, and hence the increase in the number of processes is not brought about.

In the embodiments discussed above, the layer exhibiting the same potential as that of the substrate, which is provided under the input pad and the interconnection extending from the input pad to the stage of the amplifier, is to be specified, however, a variety of regions and interconnections may also be adopted in terms of characteristics of the semiconductor device.

What is claimed is:

1. A method for manufacturing a semiconductor device comprising:

forming a device isolation layer for defining a device region and a high concentration impurity diffused region acting as a substrate/well potential take-out region;

forming a gate electrode on a surface of the substrate within the device region;

implanting ions in the device region and the high concentration impurity diffused region with the device isolation layers and the gate electrode being as implantation mask;

depositing low resistance layer at least on the upper surface of the high concentration impurity diffused region, this low resistance layer acting as a shield during operation;

depositing an inter-layer insulating film; and forming a first interconnection connected to the gate electrode and a second interconnection connected to the high concentration impurity diffused region on the said inter-layer insulating film, at least the first interconnection being disposed so that it runs above the high concentration impurity diffused region.

2. The method according to claim 1, wherein said low resistance layer is metal silicide layer deposited through a salicide process.

3. The method according to claim 1, wherein said device isolation layer is formed to separate the device region from the high concentration impurity diffused region.

* * * * *